United States Patent [19]

Klank et al.

[11] 4,110,695
[45] Aug. 29, 1978

[54] TUNING CIRCUIT FOR HIGH FREQUENCY RECEIVERS

[75] Inventors: Otto Klank, Arpke; Dieter Rottmann, Hanover; Stephan Wuttke, Laatzen, all of Fed. Rep. of Germany

[73] Assignee: Licentia Patent-Verwaltungs-G.m.b.H., Frankfurt am Main, Fed. Rep. of Germany

[21] Appl. No.: 708,754

[22] Filed: Jul. 26, 1976

[30] Foreign Application Priority Data

Jul. 24, 1975 [DE] Fed. Rep. of Germany ....... 2533072

[51] Int. Cl.² .............................................. H04B 1/16
[52] U.S. Cl. ..................................... 325/464; 325/459; 325/468
[58] Field of Search ................................ 325/419–421, 325/452, 453, 455, 457, 458, 459, 464, 465, 468

[56] References Cited

U.S. PATENT DOCUMENTS

| | | | |
|---|---|---|---|
| 3,980,951 | 9/1976 | Breeze et al. ......................... | 325/419 |
| 4,004,232 | 1/1977 | Amaya .................................. | 325/464 |
| 4,009,439 | 2/1977 | Rast ..................................... | 325/468 |

*Primary Examiner*—Robert L. Griffin
*Assistant Examiner*—Jin F. Ng
*Attorney, Agent, or Firm*—Spencer & Kaye

[57] ABSTRACT

A tuning circuit for a high frequency receiver in which the received frequency is determined by a voltage-controlled oscillator, the present tuning frequency is indicated by a counter connected to the oscillator and producing a representation of each digit of the decimal number identifying the current received frequency, representations of the digits of the number identifying the desired received frequency are fed in via a keyboard, and the decimal number representations are compared in a comparator to produce a control voltage that brings the oscillator frequency to the desired value, and in which the comparator is capable of comparing only one digit of the number representations at a time and is associated with multiplex circuitry which supplies the digits of corresponding significance thereto in sequence, starting with the most significant digit.

38 Claims, 7 Drawing Figures

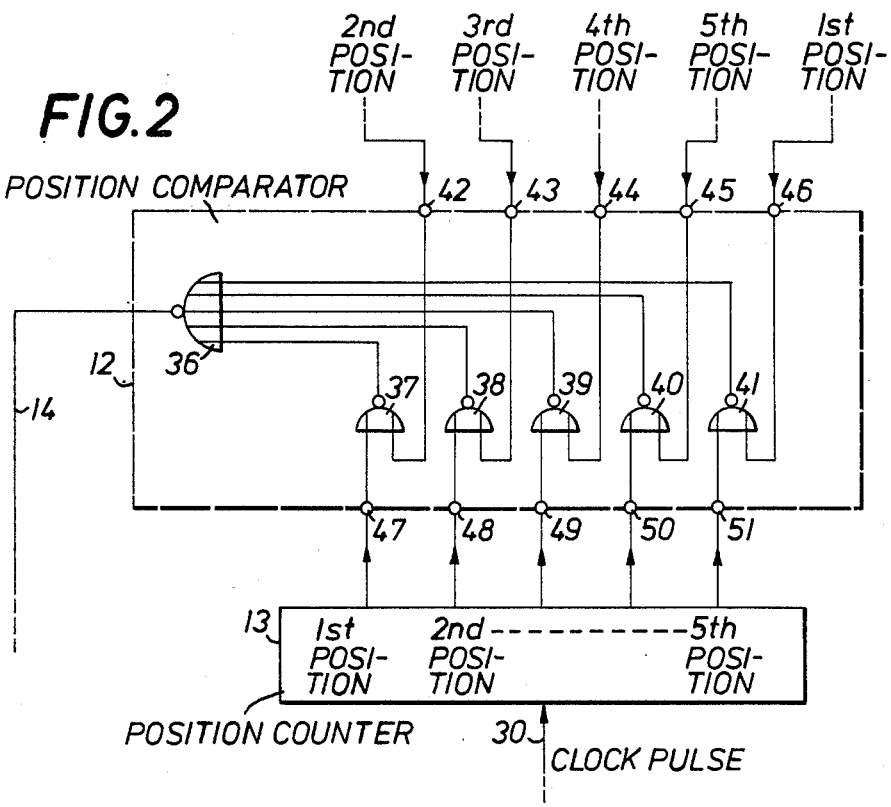
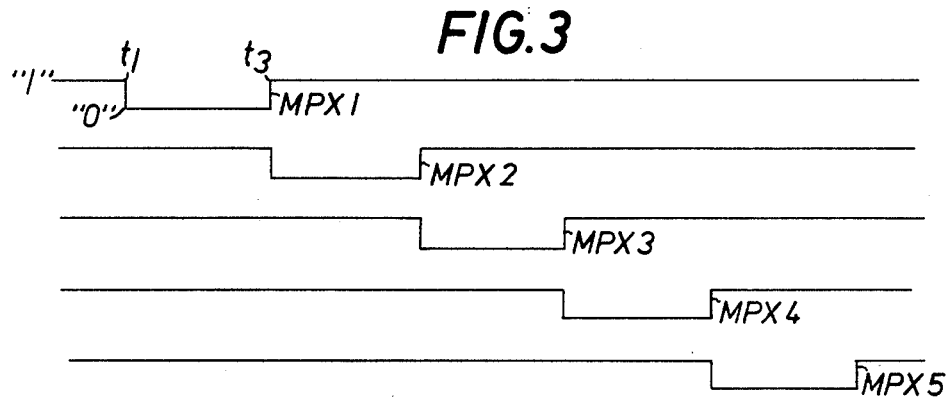

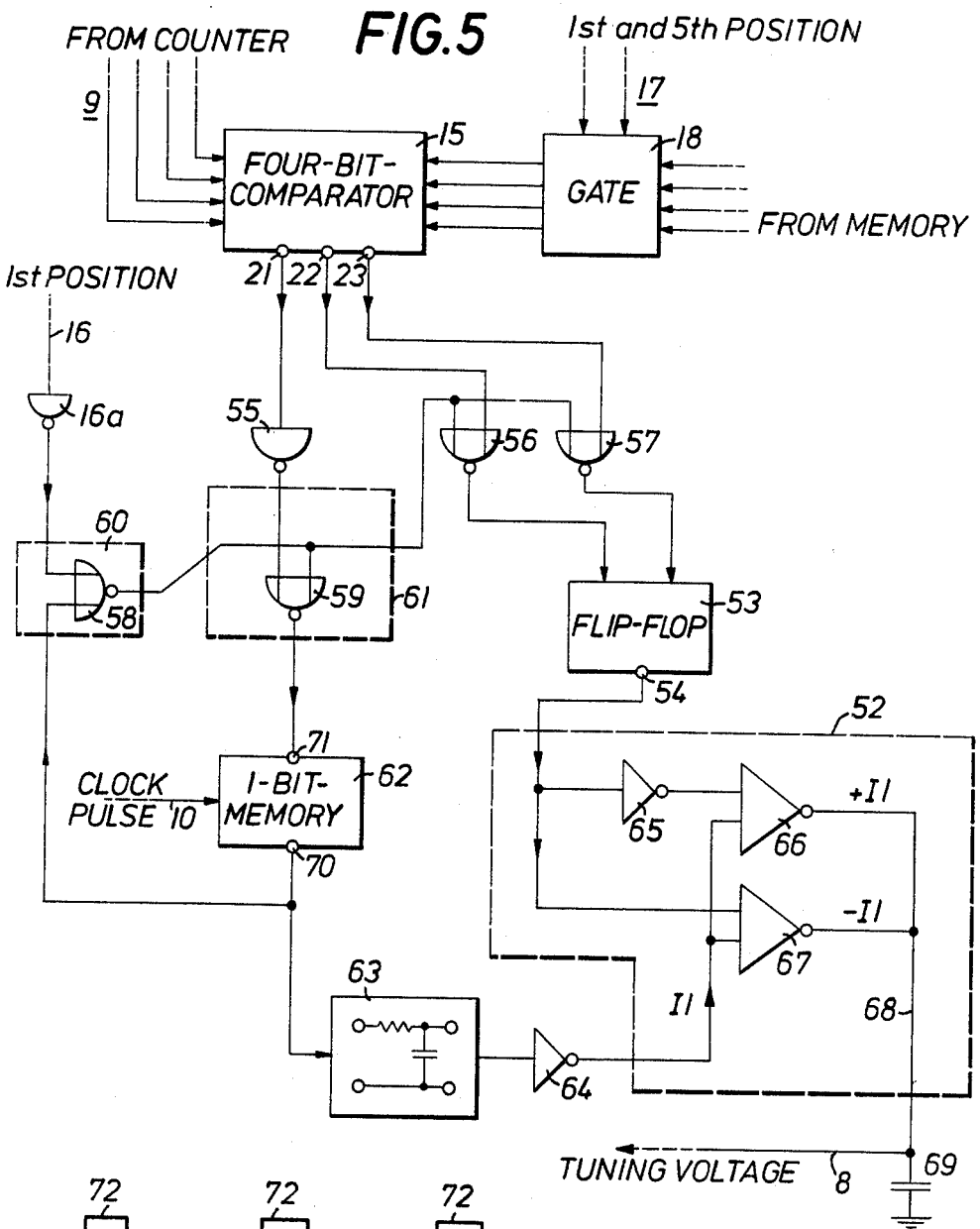

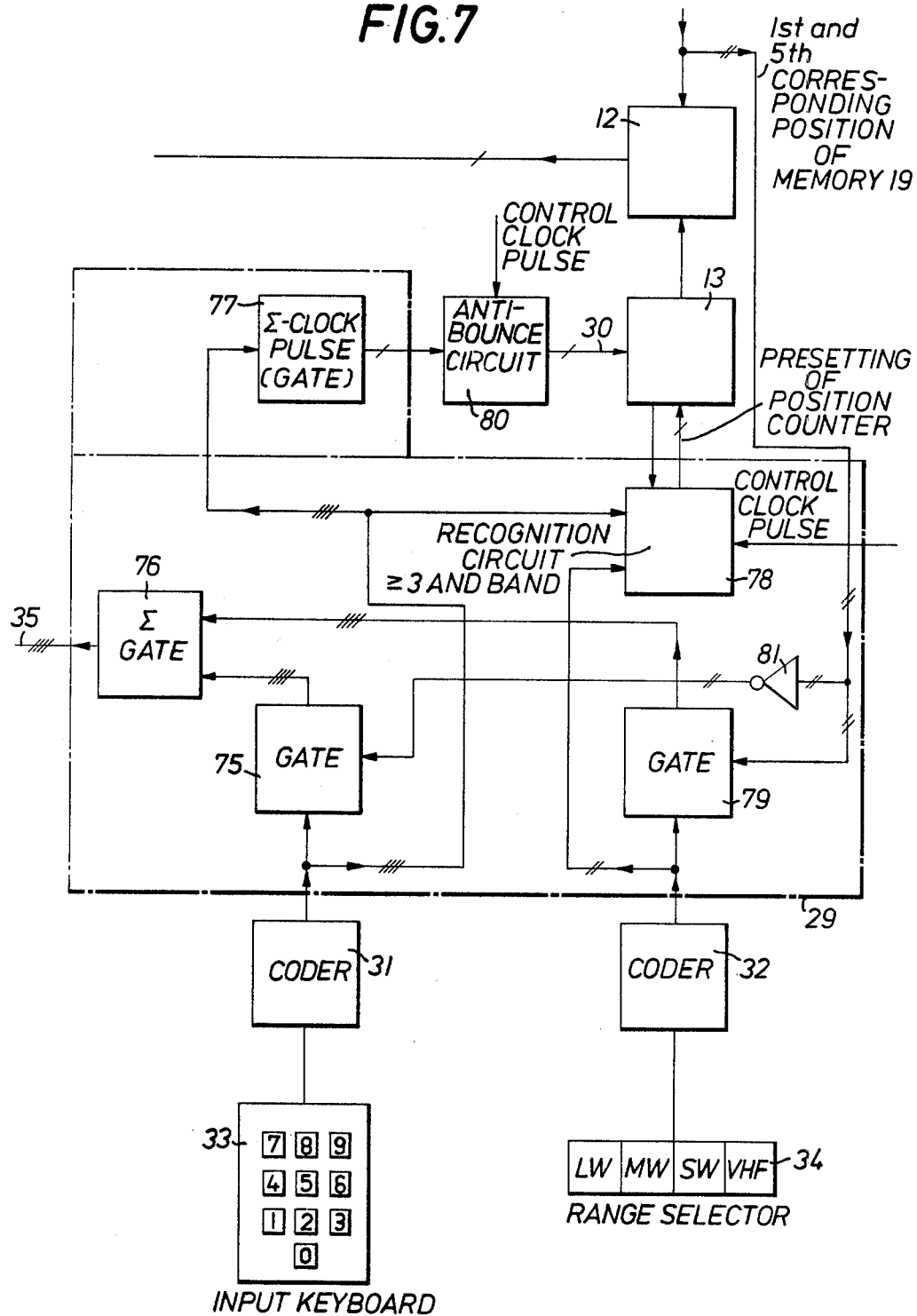

TUNING CIRCUIT FOR HIGH FREQUENCY RECEIVERS

BACKGROUND OF THE INVENTION

The present invention relates to a tuning circuit for high frequency receivers, particularly of the type employing a digital input keyboard for reading in of the desired tuning frequency and electronic tuning adjustment. High frequency receivers are generally tuned by rotating a tuning knob to sweep a frequency band which has been preselected by means of a frequency band switch. Indication of the current tuning location is provided by an indicator which moves along a scale. With such an analog type of tuning, the indication of the selected station on the scale is relatively inaccurate due to the large magnitude of the associated mechanical tolerances, so that the identity of the station to which the set is tuned cannot be ascertained with certainty from the location of the indicator on the scale. Moreover, it is necessary, in order to tune for perfect reception of the respective station, to accurately tune to a optimum setting, which usually requires an additional fine tuning indicator.

It is also known, as disclosed in the periodical "Funkschau", 1974, at pages 62 to 63 and 93 to 95, to tune VHF receivers by means of a digital input keyboard and digital frequency indication, if the receiver is provided with variable capacitance diodes. A counting device is provided to periodically count the oscillations of the mixing oscillator, under consideration of the intermediate frequency, so that the counter state displayed on an optical indicator device indicates the current receiving frequency.

For tuning to a desired station, the receiving frequency assigned to the station is punched into the keyboard, which has a series-connected coder, and is fed to a comparator. The counter state of the above-mentioned counting device is compared, by digits, with a number representing the receiving frequency, which has been keyed into a shift register of the comparator. The results of the comparisons serve to produce a control voltage for the search operation.

In the known circuit, however, there exists the drawback that, due to the digit oriented comparison, it is necessary to provide a number of comparators equal to the maximum available number of digits. In the above-mentioned periodical these comparators are called 7485 comparators. It is further necessary, in order to be able to supply the individual comparators with the numbers to be compared, to provide two additional memories for each comparator.

A further drawback is that during the course of data input, comparison is being effected between digits which are not of the same order, or significance, and this initially produces the wrong tuning voltage. This is so because, for example, the first digit fed in through the input keyboard, which is normally the highest-order, or most significant, digit, passes sucessively through those memories which are connected ahead of the memory actually assigned to that digit order. Only after all digits have been fed in will the digits of the corresponding orders of the two numbers being compared be compared correctly.

It can happen, for example, that during writing in of the desired receiving frequency value, the most significant digit of the written-in number is compared with the least significant digit of the number furnished by the counting device and this will initially produce the wrong tuning voltage. In the known circuit, special measures are required, moreover, with respect to obtaining the optimum comparison such that during comparison the individual digits are subject to different weightings and a deviation between the highest order digits causes the resulting tuning voltage to be higher than when there is a deviation between lower order digits.

SUMMARY OF THE INVENTION

It is therefore an object of the present invention to provide a circuit which overcomes the above-described drawbacks.

These and other objects of the invention are achieved, in a tuning circuit for a high frequency receiver, which circuit includes a voltage controllable superheterodyne oscillator arranged to receive a control voltage and to produce an oscillation whose frequency is determined by the value of the control voltage and determines the broadcast frequency to which the receiver is tuned, a counter connected to sense the frequency of the oscillations being generated by the oscillator and to produce therefrom a count state in the form of representations of the digits of the decimal number identifying the broadcast frequency to which the receiver is currently tuned, an input device for generating representations of the digits of a decimal number identifying the broadcast frequency to which it is desired to tune the receiver, and a comparison circuit for comparing the decimal number representations being produced by the counter and the input device to vary the control voltage in a direction to cause the number representation produced by the counter to coincide with the number representation generated by the input device, by the improvement wherein the comparison circuit includes a single comparator capable of comparing, at one time, only the representations of one digit of each of two numbers, and time multiplex circuitry connected between the counter, the input device and the comparator, for delivering to the comparator, in succession, each digit representation produced by the counter, starting with the most significant digit, and, simultaneously therewith, each digit representation of corresponding significance generated by the input device.

The input device is normally a keyboard having ten digit keys and the decimal number representating the desired tuning frequency is composed of a series of decimal digits normally punched into the keyboard in order of decreasing significance. The significance of a digit corresponds to its position in the complete number as it is normally written and the term "position" used hereinafter refers to a particular order value or significance level.

A circuit according to the present invention requires only a single comparator which receives, in multiplex operation and in succession, successive digits of the two numbers to be compared, beginning with the most significant digit, and which compares the individual digits of the two numbers in succession. Thus the memories which in the known circuit are associated with the individual comparators of the different order digit stages can be eliminated. In addition to the savings thus realized, the present invention results in a considerable reduction in the number of connecting lines required for the comparator.

For perfect operation of the above-mentioned multiplex system, there is provided, in accordance with an advantageous embodiment of the invention, in addition to the corresponding control portion of the counting device, a digit position comparator which effects the required correct association of the digit positions fed into the comparator. In this way it is assured that each digit fed to the comparator from the input keyboard is of the same order, or in the same position, as the digit presently being fed to the comparator from the counting device. A circulating memory is provided which takes over the digits of the written-in number in succession and feeds them to the comparator and which is controlled with respect to the sequential transfer of the written-in digits by the output of the digit position comparator so that the above-described digital association is achieved.

In another advantageous embodiment of the invention, a circulating memory with five memory cells is provided and connected so that the first memory cell receives the digits fed in by the input keyboard in sequence in binary coded decimal form. This circulating memory becomes effective at a point in time determined by the digit position comparator. The coded digit transferred into the first memory cell is transferred by means of clock pulses which appear during each multiplex phase to the respective next-following memory cell. The last memory cell is connected to the comparison inputs of the comparator.

For the case where the maximum number of digits of the written-in number is five, according to another advantageous embodiment of the invention, the position comparator is arranged to emit an identity signal to the circulating memory to actuate transfer of the digit stored therein into the first memory cell at that point in time at which the two digits received by its comparison inputs for comparison differ from each other by four positions. The time shift created by this position association is necessary because the digit transferred into the first memory cell will reach the last memory cell of the circulating memory, and thus arrive at the comparator, only after four multiplex phases have passed. The time which expires until the digit has traveled from the first to the last memory cell thus compensates the difference created by the fact that the position comparator emits an identity signal only when the digits fed to its comparison inputs differ from each other by four positions. The digit fed to the comparator by the last memory cell of the circulating memory then relates to the same position as the digit fed to the comparator at the same time by the counting device.

Since the number of digits written-in may differ, i.e. during VHF operation four or five digits may appear corresponding to the VHF band of 87.6 to 108.0 MHz employed, another advantageous embodiment of the invention provides for automatic determination from the highest order digit fed in, whether, for example during VHF operation, the written-in number has four or five digits. In contradistinction to the above-mentioned known circuits which does not consider different numbers of positions, it is not necessary in this case to feed in zeros ahead of the number, which simplifies operation.

BRIEF DESCRIPTION OF THE DRAWINGS

FIG. 2 is a diagram of one embodiment of a position comparator of the circuit of FIG. 1.

FIGS. 3 and 4 are pulse diagrams illustrating the sequence of the multiplex operation and the control of the circulating memory in the operation of the circuit of FIG. 1.

FIG. 5 is a basic circuit diagram of an arrangement for producing the tuning voltage from the comparison result of the sole comparator.

FIG. 6 is a pulse diagram illustrating the generation of the tuning voltage.

FIG. 7 is a basic circuit diagram of the logic circuit employed in an arrangement according to the invention.

DESCRIPTION OF THE PREFERRED EMBODIMENTS

Figure 1:
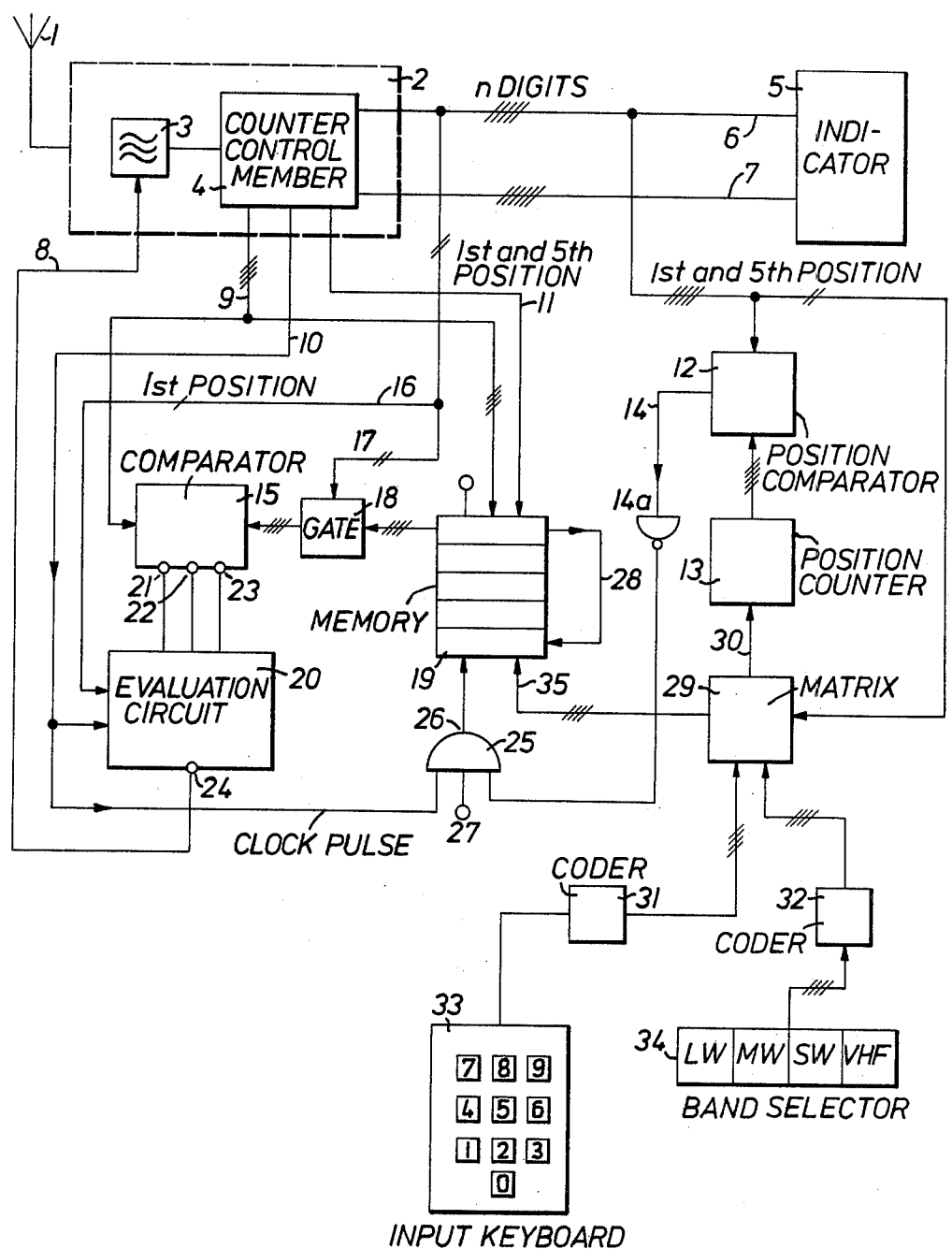
FIG. 1 is a basic circuit diagram of one preferred embodiment of a circuit according to the invention.

FIG. 1 shows a basic circuit diagram of one embodiment of a tuning circuit according to the invention in which high-frequency oscillations received by an antenna 1 are fed to a high-frequency receiver 2. The high-frequency receiver 2 may be, for example, a radio or television receiver. For the following description it is assumed that the receiver 2 is a radio receiver. The radio receiver 2 includes, inter alia, a superheterodyne oscillator 3 to produce an intermediate frequency oscillation.

The superheterodyne oscillator 3 is provided with a variable capacitance diode (not shown) to which a tuning voltage can be applied to vary the oscillator frequency so as to tune the receiver to the desired station. A counter and control member 4 is further provided, the counter counting in a known manner the oscillations of the superheterodyne oscillator 3 relating to the intermediate frequency so that the counter state of the counter indicates the received frequency. A counter in member 4 for counting the oscillations produced by the oscillator, which permits digital frequency indication, is disclosed, for example, in the periodical "Radio Mentor", 1973, pages 389–390 and the periodical "Funk-Technik", 1971, pages 157–159.

Digital frequency indication is provided in FIG. 1 by an indicator device 5 which contains, for example, so-called seven-segment indicator elements. The indicator device 5 is controlled by control member 4 via conductors 6 and 7. In the drawing the five short lines through conductor 6 and the seven short lines through conductor 7 indicate that they are composed of five lines and seven lines, respectively. This manner of identification of the number of connecting lines also applies to the other conductors shown in FIGS. 1 and 7.

For digital frequency indication in indicator device 5, the latter is controlled by counter 4 by a multiplex operation. For this purpose, indicator device 5 receives the information identifying the digits to be displayed, via the lines of conductor 7, sequentially in time in a seven-segment code. Conductor 6 is used to inform indicator device 5 which digit is presently being transmitted to the indicator device 5 via conductor 7. Thus it is accomplished that the digit-identifying bits transmitted in code via conductor 7 is fed to the correct 7-segment indicator element. The sequential display of one digit at a time on indicator device 5 takes place so rapidly that, as a result of the persistence of vision, a flicker-free picture of the sequentially displayed digits is obtained.

To control the indicator device 5 in multiplex operation as described above, control member 4 is provided in addition to the above-mentioned counter. The control member 4 interrogates the digits of the counter state of the counter in succession and feeds them to the indicator device 5 over conductor 7. Furthermore, control member 4 informs indicator device 5 which digit of the complete number is to be displayed at each instant.

The identification of the respective decimal digit positions is effected by binary signals, for example in the form of a logic "0" as shown in FIG. 3, where five positions, for example, are each identified by a logic "0". The time during which a given digit position is displayed will hereinafter be called the multiplex phase MPX. In FIG. 3, the multiplex phase MPX 1 for the first position, for example, covers the time from $t_1$ to $t_3$. The end of the first multiplex phase MPX 1 for the first position is immediately followed by the second multiplex phase MPX 2 for the second position, etc.

Reverting to FIG. 1, tuning to the desired station, is initiated by punching the appropriate keys of the input keyboard 33, each key being associated with a respective one of the decimal digits zero to nine. The desired band is selected by means of a band selector 34 which contains keys associated to the possible receiving bands LW [long wave], MW [medium wave], SW [short wave] and VHF. If, for example, a VHF station with a transmitting frequency of 87.6 MHz is to be selected, the VHF key of band selector 3 must be actuated. Then the digits eight, seven, six and zero are punched in succession on input keyboard 33.

Keyboard 33 is connected to a coder 31 which converts each decimal digit into binary coded decimal form. From coder 31 the coded digits reach a logic circuit 29, hereinafter called the matrix, whose structure will be described in detail below. The selected frequency band is also coded in a coder 32 and fed to the above-mentioned matrix 29.

From matrix 29 the binary words representing the coded digits reach a memory 19 and from there they pass through a gate 18 and enter a comparator 15. Comparator 15 also receives, via conductor 9, binary coded decimal representations of the digits of the number representing the counter state of counter 4. The comparison results from comparator 15 are fed to an evaluation circuit 20 which is connected, via a line 8, with the superheterodyne oscillator 3 and feeds a tuning voltage to its variable capacitance diode to effect tuning to the station selected via input keyboard 33.

FIG. 1 shows that the circuit includes only a single comparator 15 which is suited for comparison with respect to only one decimal digit position at a time and which receives, in multiplex operation, the digits to be compared in succession, beginning with the most significant digit. To supply the comparator 15 with the digits representing the count state of counter 4 in multiplex operation, the above-mentioned multiplex operation for digital frequency indication is utilized. Thus comparator 15 must receive in the same manner the digits punched in at input keyboard 33 so that the digits in corresponding positions can be compared in succession. This is accomplished, inter alia, by the special configuration of memory 19 and by the use of a so-called position comparator 12.

Memory 19 is a circulating memory and includes, for example, five four-bit memory cells if the maximum number of digit positions is likewise five. The first memory cell of the circulating memory 19 is connected with matrix 29 via a four-line path 35 for the parallel transfer of the coded digits. The outputs of the last, i.e. fifth, memory cell lead to gate 18. Circulating memory 19 is addressed by four clock pulses per MPX phase by control member 4 via a clocking line 11.

The parallel transfer of the coded digit fed to the first memory cell takes place under control of a clock pulse generated by AND gate 25 whose output 26 is connected to the associated setting input of the first memory cell. One input of AND gate 25 receives a clock pulse in the form of a logic "1" with every MPX phase. Another input of AND gate 25 is connected via a line 14 and an inverter 14a, with the position comparator 12 which will be described in detail below. The meeting of the AND requirement for AND gate 25, i.e. the determination of the point in time at which a coded digit is to be transferred to the first memory cell, can also be influenced by providing the AND gate with a further input 27 which can be addressed in dependence on any desired conditions.

The point in time determined by the meeting of the AND requirement of AND gate 25 at which a coded digit is transferred to circulating memory 19 must be selected to assure that the position of the digit being fed to comparator 15 from memory 19 corresponds to the position of the digit being received at the same time from counter 4. The four bits transferred in parallel into the first cell of memory 19 are transferred serially, by the four clock pulses on line 11, to the respective next-following memory cell as a result of circulating memory 19 being controlled by four clock pulses per MPX phase. After four MPX phases, a coded digit will thus have been completely transferred to the last memory cell. From there the four bits of that digit are fed in parallel via gate 18 to comparator 15. Thus a time of four MPX phases expires before the coded digit which had been transferred into the first memory cell reaches comparator 15.

This delay in time is considered by position comparator 12 which compares the positions of the digits being supplied to indicator 5 with the positions of the digit punched in via keyboard 33. Due to the above-mentioned time shift, the position comparator compares those positions which differ by four orders. For example, position comparator 12 will emit a positive comparison result, via line 14 and inverter 14a, which has the form of a logic "1" at the input of AND gate 25 is position comparator 12 receives through conductor 6 signals indicating the first, or most significant, digit position and from matrix 29 a signal identifying the fifth, or least significant, digit position of the digit number punched in at keyboard 33. Since the AND gate 25 also receives one clock pulse with each MPX phase, the AND condition is met with the above-mentioned position association in position comparator 12 and in the present case the digit punched into keyboard 33 relating to the fifth position is transferred to the first memory cell. After four further MPX phases the digit corresponding to the fifth position has reached comparator 15. At this time, comparator 15 also receives the digit corresponding to the fifth position from counter 4.

One embodiment of the position comparator 12 is shown in FIG. 2. Position comparator 12 is controlled by matrix 29 via a position counter 13. As an example, it is hereinafter assumed that the desired receiving frequency of 108.0 MHZ is punched in via input keyboard 33. The requirement exists that the digits be punched in beginning with the most significant digit, this being the customary way of feeding a multi-digit number into an instrument. In the present case, digit one is thus fed in first.

Upon actuation of the "1" key of keyboard 33, the clock pulse input 30 of position counter 13 receives a clock pulse via matrix 29. This produces a logic "0" at the first position output of position counter 13 while the other outputs of counter 13 present logic "1". The outputs of position counter 13 are connected with inputs 47–51, respectively, of position comparator 12. Comparator 12 also receives, via inputs 42–46, the MPX signals in the form of logic "0"s associated to the respective positions of the digits being supplied to indicator 5.

Position comparator 12 includes five NOR gates 37–41 whose outputs control a further NOR gate 36. The positions selected in accordance with the above-mentioned time shift are compared through each one of the NOR gates 37–41. If, as in the present case, the first position digit was fed in by input keyboard 33, transfer of the first position digit into the first memory cell of circulating memory 19 must take place only if indicator device 5 is presently indicating the digit corresponding to the second position of the number representing the counter state of counter 4.

Since in this case a logic "0" is present at both inputs of NOR gate 37, a logic "1" will appear at the output of NOR gate 37 while the outputs of all of the other NOR gates 38–41 are at logic "0". Whereas previously all of the inputs of the other NOR gate 36 were at logic "0", the input of NOR gate 36 which is controlled by the output of NOR gate 37 has now jumped to logic "1". Therefore, a logic "0" will appear at the output of NOR gate 36 which "0" appears as a "1" at AND gate 25 due to the action of inverter 14a. Since AND gate 25 also receives, via line 10, a clock pulse in the form of a logic "1" with every MPX phase, and assuming terminal 27 to be absent or to permanently receive a logic "1", the AND condition for AND gate 25 is met at this time so that transfer of the first position digit into the first memory cell is effected at the proper time.

If, then, the digit for the second position is punched into keyboard 33, position counter 13 receives a second clock pulse so that the logic "0" previously present at the first position output is shifted to the next output which is associated with the second position. The transfer of the punched in second position digit to memory 19 thus is correspondingly effected at the point in time when position comparator 12 receives at its input 43 the MPX signal of the third position of the number representing the counter state of counter 4. The corresponding applies for the subsequent digit positions.

The input range for the individual frequency bands are as follows:
LW: 150 . . . 350 (input always three digits)
MW: 500 . . . 1600 (input three or four digits)
SW: 6,000 . . . 25,000 (input four or five digits)
VHF: 87.60 . . . 108.00 (input four or five digits)

It can be seen that various tuning inputs can involve different numbers of digits. In order to achieve the above-described position association for the position comparator, the circuit must be able to recognize how many digits are to be fed in. For this purpose use is made of the fact that, for example, for the short wave (SW) band and for the VHF band, four digits are always fed in if the first digit fed in, i.e. the highest order digit, is not a 1 or a 2. If, for example, the VHF band has been selected and the number 8 is fed in first, that means that only a four-digit number can be fed in. For numbers other than zero and 1, the position counter 13 which acts as an input digit position counter is therefore set ahead by one position before the first digit is transferred so that the correct position of this digit is automatically indicated by the corresponding output of the position counter. Thus the correct position association for the comparison is achieved independently of the number of digits that are fed in.

FIG. 3 shows the already mentioned MPX phases which are each represented by a logic "0" and which control the multiplex operation.

FIG. 4 depicts the relation between the MPX phases, the shift pulses for circulating memory 19, and the setting pulses for the transfer of the coded digits into the first memory cell of circulating memory 19 which, however, become effective only if an input key is actuated. In the second row of FIG. 4 it can be seen that during each MPX phase the circulating memory 19 receives starting at time $t_1$, four shift pulses with which the bits of a coded digit in a memory cell are shifted into the next following memory cell of circulating memory 19.

Transfer of the bits of a punched-in digit into the first memory cell can take place within an MPX phase, for example at time $t_2$. From the output of the last memory cell of circulating memory 19 the bits representing coded digits are shifted in sequence back to the first memory cell so that a series of digits received by circulating memory 19 remain available for comparison until tuning to a different station is desired.

With the above-described position association by means of position comparator 12 care is taken that at the time when the bits of a digit are returned to the first memory cell through return line 28 a digit relating to a different position cannot be transferred to the first memory cell. Once digits for all five positions have been fed in through input keyboard 33, all memory cells of circulating memory 19 are occupied. The bits representing the coded digits circulate through circulating memory 19 through line 28 for as long as a comparison is desired. This circulation remains in effect even if the radio receiver has been tuned to the desired station by the tuning voltage generated by evaluation circuit 20 so that possible deviations of the oscillator frequency immediately cause the set to be returned to the station.

FIG. 5 shows one embodiment of the evaluation circuit 20 of FIG. 1 together with comparator 15 and gate 18. Comparator 15 is, for example, a four-bit comparator of the type 7485 whose left four comparison inputs receive the BCD representations of the digits from counter 4 and whose right comparison inputs receive the BCD representations of the punched-in digits from memory 19. Comparator 15 has three outputs 21, 22 and 23 at each of which appears, depending on the respective comparison result, a signal, for example in the form of a logic "1".

Upon identity of the simultaneously received digits, relating to the same position, a logic "1" appears at output 21. If, however, for a given position, the punched-in digit has a lower value than the digit received by comparator 15 from counter 4, a logic "1" appears at output 22 and in the opposite case at output 23. The two outputs 22 and 23 thus determine the direction of variation of the tuning voltage, depending on whether the punched-in frequency value number is greater or smaller than the number provided by counter 4.

It has already been mentioned that the highest order position digit is always fed in first. The evaluation circuit is designed so that as a result of the generated tuning voltage it initially produces identity at the highest order digit position. Only if the digits in the highest order position are identical, will a comparison of the second position be evaluated, etc. If, for example, only the two third position digits coincide by accident, this coincidence is not evaluated because the digits in the preceding positions still differ.

The described sequence of the comparison is produced by two gates 60 and 61 in conjunction with a one-bit memory 62. It is assumed that the first position digit of the number fed from counter 4 to comparator 15 coincides with the first position digit punched in at keyboard 33. A logic "1" then appears at output 21 of comparator 15 and is fed via an inverter 55 as a logic "0" to one input of a NOR gate 59. Gate 60 also includes a NOR gate 58 whose upper input is controlled, via an inverter 16a, by the signal identifying the first position, i.e. the logic "0" of MPX phase MPX 1. The lower input of NOR gate 58 is connected with the output 70 of one-bit memory 62. At the beginning of the comparison of the first position digits, memory 62 is initially unchanged so that "0" potential is present at its output 70. Since NOR gate 59 is effectively enabled by the output from NOR gate 58, a signal can reach input 71 of one-bit memory 62 via gate 61, i.e. the output state of gate 61 can change, only during the first MPX phase.

If the comparison of the first position digits is negative, i.e. indicates lack of coincidence, a logic "0" is present at input 71 which is transferred by means of a clock pulse to one-bit memory 62. This clock pulse is fed to one-bit memory 62 via line 10 once with every MPX phase. The clock pulse charges the one-bit memory 62 so that the binary information present at its input 71 is available at output 70. Thus a logic "0" appears at output 70 if the comparison of the first position was negative. Therefore, during the following MPX phase, "1" potential appears at the output of NOR gate 58 which is fed to the second input of NOR gate 59. Thus gate 61 is practically blocked for the next following digit positions if the comparison of the first digit was negative.

If the four-bit comparator 15 detects identity of the first position digits, one-bit memory 62 stores a logic "1" which is available at its output 70. As a result the lower input of NOR gate 58 receives, during the second MPX phase, a logic "1" and the upper input receives a logic "0". At the output of NOR gate 58 there thus appears a "0" potential so that the other NOR gate 59 of gate 61 can again supply input 71 with a logic "1" if the second position digits coincide. One-bit memory 62 thus always stores a logic "1" if the digits fed to comparator 15 are identical.

The above-described logic linkage formed by the two NOR gates 58 and 59 thus produces the desired operation of varying the frequency of oscillator 3, and thus the count state of counter 4, first until the first position digits coincide, etc. If, thus, the digits of two positions which are not the two highest-order positions accidentally coincide, this coincidence is not initially utilized by the evaluation circuit and, advantageously, has no influence on the generation of the tuning voltage.

If the punched-in frequency value number differs from the number represented by the counter state of counter 4, it must be initially determined whether the punched-in number is larger or smaller than the counter state number. That determination determines the direction in which the tuning voltage must be varied in order to vary the oscillator frequency in a sense which reduces the magnitude of the deviation.

The desired direction or polarity, of the tuning voltage variation is determined by the stable state of a flip-flop 53, which depends on whether the punched-in number is larger or smaller than the number represented by the counter state of counter 4. The outputs 22 and 23 of comparator 15, which are associated to the comparison results "smaller" and "larger", respectively, are each connected with one input of a respective one of NOR gates 56 and 57. The other input of each of NOR gates 56 and 57 is enabled by the output signal from NOR gate 58. The outputs of the two NOR gates 56 and 57 lead to respective flip inputs of flip-flop 53.

The output from NOR gate 58 assures that flip-flop 53 can initially be set only to correspond to the comparison result of the first position digits. Only if the first position digits are identical will enabling by means of NOR gate 58 permit the setting of flip-flop 53 to be controlled by the outputs of the two NOR gates 56 and 57.

The output 54 of flip-flop 53 which presents either a "0" or "1" potential, is connected to a circuit 52 which either charges or discharges a capacitor 69 to produce the tuning voltage. The voltage across capacitor 69 is fed to the oscillator or tuning member 3 of the receiver via a line 8.

Circuit 52 includes two analog amplifiers 66 and 67 each having two inputs. According to the logic state at output 54, which output is connected via an inverter 65 with one input of analog amplifier 66 and directly with one input of analog amplifier 67, capacitor 69 is charged by an output voltage from analog amplifier 66 or discharged by an output voltage from analog amplifier 67. The degree of charging or discharging of capacitor 69 is determined by the voltage applied to the other inputs of the two analog amplifiers 66 and 67, which voltage is derived by a lowpass filter 63 and an analog inverter 64 from the output 70 of the one-bit memory 62, the other inputs being connected together and to the output of amplifier 64.

The generation of the tuning voltage will now be explained with reference to FIG. 6. It has already been mentioned that a "1" potential appears at output 70 of one-bit memory 62 only if at least the two digits associated to the first position coincide. If the subsequent comparison of the second position digits indicates an inequality, the potential at output 70 goes back from "1" to "0".

FIG. 6 now shows several possible pulse shapes which can appear at output 70. The upper waveform is produced when only the first position digits coincide. There then appear periodic pulses 72 which occur whenever the first position digits are presently being compared, i.e. during each phase MPX 1. These pulses are fed to the lowpass filter 63 of FIG. 5 at whose output an average direct voltage appears, as shown in FIG. 6 by the dashed line associated with the upper waveform. It can be seen that the average direct voltage in this case is relatively low. Analog inverter 64 then produces therefrom a relatively high voltage on the basis of which a current I1 flows into that analog amplifier 66 or 67 which has been activated by the output from flip-flop 53. Depending on the direction of the previously determined deviation between the digits being compared, capacitor 69 is then discharged by a current −I1 or charged by a current +I1. Since, in the case on which the upper waveform of FIG. 6 is based, only the first position digits coincide, the remaining deviation between the two numbers is still relatively great so that a relatively high voltage appears at the output of analog inverter 64.

The center waveform of FIG. 6 represents the condition when the digits in several positions of the two numbers already coincide. At output 70 there then appear the wider pulses 73. Due to this greater pulse width, a higher average direct voltage U appears at the output of lowpass filter 63, resulting in the production of a relatively low direct voltage by analog inverter 64. Thus only a small current I1 flows to analog amplifiers 66 and 67 so that the charging or discharging of capacitor 69 is effected to a lesser degree than in the first-described case.

Once the digits in all of the positions of the numbers fed to comparator 15 are identical, the long, essentially constant, pulse 74 appears at the output 70 of the one-bit memory 62, as represented by the bottom waveform of FIG. 6. A maximum direct voltage then appears at the output of lowpass filter 63 so that, due to the influence of analog inverter 64, current I1 is practically zero and no change in the tuning voltage at capacitor 69 takes place. The radio receiver is now tuned to the station whose frequency corresponds to the number that was punched in via the input keyboard 33.

If use is made of amplifiers 66 and 67 having an exponential transmission characteristic, it is possible to realize an identical dependence between the charging rate and the number of identity results obtained, for example:

with identity at only the first position, a rate of 10 V/S;
with identity at only the first and second positions, a speed of 1 V/S;
and with identity at only the first, second and third positions, a speed of 0.1 V/S.

There also exists the possibility of utilizing more positions of the counting result of counter 4 than necessary for the comparison to produce the tuning voltage and more than are required for optical display. In this way, a fine tuning voltage can be generated already when there is a change in the oscillator frequency without such change becoming visible on the display unit 5.

FIG. 7 shows the basic circuit diagram of matrix 29 of FIG. 1 in which the two fed-in BCD bit sequences representing the desired frequency band and the individual digits of the desired frequency are combined into a sequence and the setting pulses for the position counter are obtained. The matrix includes a gate 79 which is controlled by those signals from the circuit 4 which correspond to the first and the fifth positions in memory 19 so that the frequency band information from coder 32 is transmitted only during the first position phase, then only through the lines of the first two bits, and the fifth position phase, then only through the lines of the last two bits. Gate 75, however, is controlled in the opposite way so that the frequency information is transmitted completely only during the second, third and fourth position phases and only through the lines which are left free by gate 79 during the first and fifth position phases. The two gates can also be considered to be time controlled electronic switches for the punched-in data. In a summing gate circuit 76 a sum is formed of the two outputs of gate 75 and gate 79 and fed to circulating memory 19 via lines 35.

A pulse is generated in gate circuit 77 during each actuation of the input keyboard 33 and each such pulse is fed to position counter 13 via anti-bounce-circuit 80. Buffer circuit 80 bridges contact uncertainties during a limited period of time. A recognition circuit 78 furnishes a signal for certain combinations of the selected band and the first digit punched in, which signal additionally presets position counter 13 by one position level so that the first digit punched in and all subsequent digits are fed into memory 19 to correspond to one position further down in order of significance. This always applies for the band LW (always only three positions) and for the bands, MW, SW and VHF only if the first digit is equal to or greater than three.

The possibility of using two of the bits associated with the first and fifth coded digit representations fed into the memory 19 to provide band identifying information exists because the highest order digit can only be 0, 1 or 2 and the lowest order digit can only be 0 or 5, so that two bits are sufficient to identify each of those digit values. In this case, transmission of the bits identifying the selected band from the last cell of memory 19 to comparator 15 is blocked by the application of control signals via conductor 17 to the corresponding paths of gate 18 when the lines of conductor 6 associated with the first and fifth digits are activated.

The frequency range of the receiver 2, and particularly oscillator 3, via the frequency band selector 34 can be made in known mechanical manner.

It will be understood that the above description of the present invention is susceptible to various modifications, changes and adaptations, and the same are intended to be comprehended within the meaning and range of equivalents of the appended claims.

What is claimed is:

1. In a tuning circuit for a high frequency receiver, which circuit includes a voltage controllable superheterodyne oscillator arranged to receive a control voltage and to produce an oscillation whose frequency is determined by the value of the control voltage and determines the broadcast frequency to which the receiver is tuned, a counter connected to sense the frequency of the oscillations being generated by the oscillator and to produce therefrom, at an output of the counter, a count state in the form of representations of the digits of a first decimal number identifying the broadcast frequency to which the receiver is currently tuned, input means for generating representations of the digits of a second decimal number identifying the broadcast frequency to which it is desired to tune the receiver, the input means having an output at which the representations of the second decimal number digits appear, and a comparison circuit for comparing the decimal number representations being produced by the counter and the input means to vary the control voltage in a direction to cause the number representation produced by the counter to coincide with the number representation generated by the input means, the improvement wherein said comparison circuit comprises: a single comparator having first and second inputs and capable of comparing, at one time, only the representations of one digit of each of two numbers; and time multiplex means interconnecting the output of said counter, the output of said input means and said comparator inputs, for delivering to said first comparator input, in succession, each digit representation produced by said counter, starting with the most significant digit, and for delivering, simultaneously therewith to said second comparator input, each digit representation of corresponding significance generated by said input means.

2. An arrangement as defined in claim 1 wherein said counter comprises a control portion arranged to effect multiplex operation for feeding the digit representations of the first number in succession to first comparison inputs of said comparator during successive multiplex phases each associated with a respective level of digit significance and wherein said multiplex means comprise a position comparator connected for comparing the significance position of the digit representation being fed from said counter to said comparator with that of the digit representation currently being generated by said input means, and a circulating memory having a control input connected to the output of said position comparator, a signal input connected to receive the digit representations generated by said input means, and a signal output for feeding such digit representations in succession to second comparison inputs of said comparator.

3. An arrangement as defined in claim 2 wherein said circulating memory comprises five successive memory cells each having a capacity of four bits, the cell at one end of said memory being the memory input cell and being connected to said memory signal input and the cell at the opposite end of said memory being the memory output cell and being connected to said memory signal output for supplying the content of said memory output cell to the second comparison inputs of said comparator, said counter control portion is arranged to supply shift clock pulses to said memory for shifting a digit representation from one memory cell to the next adjacent memory cell during each multiplex phase, and said multiplex means further comprise a logic matrix connected between said input means and said memory signal input for controlling delivery of each digit representation to said memory signal input.

4. An arrangement as defined in claim 3 wherein said position comparator is arranged to emit an identity signal to said memory control input each time the digit representation being generated by said input means coincides in time with delivery to said single comparator of the representation of the next lower order digit from said counter.

5. An arrangement as defined in claim 4 wherein said counter control portion is further arranged to supply an input control clock pulse during each multiplex phase and said memory control input comprises an AND gate having a first input connected to receive the identity signals from said position comparator, a second input connected to receive the input control clock pulses from said counter control portion, and an output connected to effect delivery to said memory input cell of the digit representation being generated by said input means when signals are applied in coincidence to said first and second AND gate inputs.

6. An arrangement as defined in claim 4 wherein said multiplex means are arranged to supply, to said position comparator, during the duration of each multiplex phase, signals representing a respective logic state corresponding, to the order of significance of the digit whose representation is then being produced by said counter.

7. An arrangement as defined in claim 6 wherein said input means comprises an input keyboard permitting the digits of the second number to be punched in, starting with the most significant digit and in descending order of significance, and said multiplex means further comprise an input position counter connected to supply to said position comparator signals identifying the order of significance of the last digit punched in at said keyboard.

8. An arrangement as defined in claim 7 wherein said input position counter comprises a shift register composed of a plurality of 1-bit memory cells equal to the maximum number of digits in each number, each cell having an output connected to said position comparator, said shift register having a shift input connected to receive shift signals from said logic matrix.

9. An arrangement as defined in claim 8 wherein said input position counter is a Johnson counter having three shift register cells corresponding to an empty state and five counting states, and a decoder connected to the outputs of said Johnson counter to transform the Johnson code produced by said Johnson counter into a 1-of-6 code and to supply the latter code to said position comparator.

10. An arrangement as defined in claim 8 wherein said shift input of said shift register is arranged to receive a shift pulse from said logic matrix during each actuation of a key on said input keyboard for setting said input position counter ahead by a count representing a change of one order of significance.

11. An arrangement as defined in claim 10 wherein said logic matrix is arranged to preset said input position counter when the first digit punched in at said keyboard has a value at least equal to three for establishing a differentiation between frequency numbers having different numbers of digits.

12. An arrangement as defined in claim 3 wherein the receiver is arranged to receive a plurality of frequency bands and said circuit further comprises: band selector means having a plurality of keys each arranged to be actuated for providing a signal representing a respective band to be received, and a coder connected to receive each such signal to produce a binary coded representation of a particular digit upon actuation of a corresponding key of said band selector means.

13. An arrangement as defined in claim 12 wherein each binary coded digit representation indicating a selected band is fed to said lotic matrix and then to said circulating memory.

14. An arrangement as defined in claim 13 wherein each digit representation of a selected band is constituted by four bits whose values are defined by a BCD code.

15. An arrangement as defined in claim 14 wherein each digit representation of each of said first and second numbers to be compared is constituted by four bits whose values are defined by a BCD code.

16. An arrangement as defined in claim 15 wherein each of said first and second numbers has a maximum of five digits and, for the first number, the least significant digit can only have a value of zero or five, which can each be represented by two bits, and the most significant digit, of a total of five digits, can only have a value of zero, one or two, which is always characterized by two bits.

17. An arrangement as defined in claim 16 wherein said logic matrix uses the other two bits not required to identify the least significant digit and the other two bits not required to identify the most significant of five digits of said first number to provide band identification information and feeds such information together with the least significant and most significant digit bits to said circulating memory.

18. An arrangement as defined in claim 17 wherein said cells of said circulating memory are interconnected for serial transfer of bits from one cell to the next, said counter control portion supplies four shift clock pulses to said memory during each multiplex phase, and said circulating memory further comprises a return line for shifting the bits of a digit representation from said memory output cell to said memory input cell under control of said shift clock pulses.

19. An arrangement as defined in claim 18 further comprising signal transfer means connected for feeding the bits of successive digit representations produced by said counter to said circulating memory output cell under control of said shift clock pulses.

20. An arrangement as defined in claim 19 wherein said single comparator is a four-bit comparator having two inputs each composed of four lines, said circulating memory output cell has four output lines each connected to a respective bit location thereof, and further comprising a controllable multiple gate having four signal paths each connected between one of said memory output cell output lines and a respective one of said lines of one of said single comparator inputs.

21. An arrangement as defined in claim 20 further comprising gating control means connected to said multiple gate for blocking transmission via those paths associated with the bits providing band identification information during transmission from said memory output cell of the digit representations containing those bits.

22. An arrangement as defined in claim 21 wherein said comparison circuit further comprises an evaluation circuit including: a bistable multivibrator connected to said single comparator to assume a respective one of its two output states depending on whether the second number digit whose representation is being delivered to said single comparator is larger or smaller than the first number digit whose representation is being delivered to said single comparator; and control voltage adjusting means connected for varying the oscillator control voltage in a direction determined by the output state of said multivibrator.

23. An arrangement as defined in claim 22 wherein said single comparator includes an identity output arranged to provide a signal when the first and second number digit representations being delivered to said single comparator are identical, and said identity output is connected to said evaluation circuit.

24. An arrangement as defined in claim 23 wherein said evaluation circuit is arranged to initially respond only to comparison of the representations of the highest order digits of the first and second numbers and to respond to comparison of representations of digits of a lower order only after identity has been established with respect to the digits of the next higher order.

25. An arrangement as defined in claim 24 wherein said evaluation circuit comprises: a one-bit memory having a clock pulse input connected to receive one clock pulse during each multiplex phase and arranged to produce an output pulse pattern determined by its logic states; gating means connected between said comparator identity output and said one-bit memory; and a lowpass filter connected to the output of said one-bit memory for producing a direct voltage from the pulses pattern produced by said one-bit memory.

26. An arrangement as defined in claim 25 wherein said gating means are arranged to be enabled during each multiplex phase associated with the highest order digit of each of the first and second numbers and by the presence of a signal at the output of said one-bit memory, whereby a signal from said single comparator identity output associated with a particular order of significance below the highest order can be conducted to said one-bit memory only if such signal has been produced with respect to the digits of the next higher order.

27. An arrangement as defined in claim 1 wherein said tuning circuit further comprises an optical display device connected to display said first decimal number and arranged to receive each digit of that number simultaneously with delivery of the corresponding digit representation to said single counter.

28. An arrangement as defined in claim 27 wherein production of the display is blocked during generation of a number representation by said input means and during at least part of the tuning process occurring subsequent to such generation.

29. An arrangement as defined in claim 28 wherein such blockage is controlled by an output signal from said comparison circuit in such a manner that the blockage is eliminated when identity exists between at least the most significant digits of said numbers.

30. An arrangement as defined in claim 27 wherein transmission via the audio frequency channels of the radio receiver are blocked during generation of a number representation by said input means and during at least part of the tuning process occurring subsequent to such generation.

31. An arrangement as defined in claim 30 wherein such blockage is controlled by an output signal from said comparison circuit in such a manner that the blockage is eliminated when identity exists between at least the most significant digits of said numbers.

32. An arrangement as defined in claim 1 wherein at least part of said tuning circuit is constituted by an integrated MOS unit.

33. An arrangement as defined in claim 1 wherein said comparison circuit comprises a one-bit memory connected to produce an output signal when identity occurs between the digits of said first and second number which are of a certain order of significance and identity has occurred for all higher order digits; and a special memory connected to store the output signal produced by said one-bit memory during a selected multiplex phase, the output signal from said special memory being employed to block at least one of display of the first number and audio signal transmission through the receiver during generation of a number representation by said input means and during at least part of the tuning process occurring subsequent to such generation.

34. An arrangement as defined in claim 1 wherein said tuning circuit further comprises an optical display device connected to display at least the most significant digits of said first decimal number, and said single comparator is arranged to compare a larger number of digits than is displayed by said indicator to permit production of a tuning voltage variation upon occurrence of a shift in the frequency of said oscillator which is too small to affect the number appearing on said optical display.

35. An arrangement as defined in claim 1 wherein said multiplex means comprise a circulating memory connected to receive the digit representations generated by said input means and arranged to be at least partially erased at the beginning of generation of representations of a new second decimal number.

36. An arrangement as defined in claim 35 wherein said multiplex means further comprise an input position counter connected to supply signals identifying the order of significance of the digit whose representation was last generated by said input means, and said tuning circuit further comprises band selector means for providing an indication of the frequency band in which tuning is to be effected, and erasure of said memory is effected by a change in said position counter from an empty state to a state indicating generation of a representation of one of the two highest order digits or by selection of a new frequency band.

37. An arrangement as defined in claim 1 wherein said multiplex means comprises a logic matrix and said input means comprises a digit representation coder connected to inputs of said logic matrix, and said inputs of said logic matrix have a high impedance and have the form of contact or sensor inputs.

38. An arrangement as defined in claim 1 wherein said input means comprises a digit representation coder having high impedance inputs in the form of contact or sensor inputs.

* * * * *